(12) United States Patent
Hayashida et al.

(10) Patent No.: US 9,837,640 B2
(45) Date of Patent: Dec. 5, 2017

(54) METHOD FOR REPAIRING BANK, ORGANIC EL DISPLAY DEVICE, AND METHOD FOR MANUFACTURING SAME

(71) Applicant: JOLED INC., Tokyo (JP)

(72) Inventors: Yoshiki Hayashida, Osaka (JP); Kazuhiro Kobayashi, Kanagawa (JP); Toshiaki Onimaru, Tokyo (JP); Takayuki Shimamura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/122,716

(22) PCT Filed: Feb. 24, 2015

(86) PCT No.: PCT/JP2015/000918
§ 371 (c)(1),
(2) Date: Aug. 31, 2016

(87) PCT Pub. No.: WO2015/133090
PCT Pub. Date: Sep. 11, 2015

(65) Prior Publication Data
US 2017/0077460 A1    Mar. 16, 2017

(30) Foreign Application Priority Data
Mar. 7, 2014    (JP) .................. 2014-045470

(51) Int. Cl.
*H01L 51/56*    (2006.01)
*H01L 27/32*    (2006.01)

(52) U.S. Cl.
CPC .......... *H01L 51/56* (2013.01); *H01L 27/3246* (2013.01); *H01L 2251/303* (2013.01); *H01L 2251/568* (2013.01)

(58) Field of Classification Search
CPC ......... H01L 2251/303; H01L 2251/568; H01L 27/3246; H01L 51/56
See application file for complete search history.

(56) References Cited

U.S. PATENT DOCUMENTS

| 4,960,611 A | * | 10/1990 | Fujisawa | ................. | B05D 3/06 427/140 |
| 5,246,804 A | * | 9/1993 | Furukawa | ................. | G03F 1/72 356/237.5 |

(Continued)

FOREIGN PATENT DOCUMENTS

| JP | 2000082405 A | * | 3/2000 |
| JP | 2007090303 A | * | 4/2007 |

(Continued)

OTHER PUBLICATIONS

International Search Report (ISR) in International Pat. Appl. No. PCT/JP2015/000918, dated May 19, 2015.

*Primary Examiner* — Sophia Nguyen
(74) *Attorney, Agent, or Firm* — Greenblum & Bernstein, P.L.C.

(57) ABSTRACT

A bank repair method for repairing a defect portion of a bank in a process of manufacturing an organic electroluminescence (EL) display device including a substrate, banks formed over the substrate, and light-emitting layers formed in concave spaces defined by the banks. The bank repair method includes: examining whether or not a bank having a defect portion is present; and when a bank having a defect portion is present, repairing the bank by applying a repair material containing a gas adsorbent to the defect portion and curing the repair material; and after curing the repair material, baking the repair material by irradiating the repair material with infrared laser light.

5 Claims, 15 Drawing Sheets

(56) References Cited

U.S. PATENT DOCUMENTS

| | | | | |
|---|---|---|---|---|
| 5,348,924 A * | 9/1994 | Potter | ................... | B01J 20/186 |
| | | | | 502/10 |
| 6,537,645 B1 * | 3/2003 | Yokoyama | ................ | C03C 8/14 |
| | | | | 428/119 |
| 9,111,886 B2 * | 8/2015 | Miyazawa | .......... | H01L 27/3246 |
| 9,755,193 B2 * | 9/2017 | Onimaru | ............. | H01L 27/3246 |
| 2002/0094382 A1 * | 7/2002 | Imai | ..................... | C03C 17/001 |
| | | | | 427/282 |
| 2003/0171059 A1 * | 9/2003 | Kawase | ................... | H01J 9/38 |
| | | | | 445/24 |
| 2004/0175631 A1 * | 9/2004 | Crocker | ................. | C23C 18/14 |
| | | | | 430/5 |
| 2005/0140706 A1 * | 6/2005 | Cheng | ................... | B41J 2/2139 |
| | | | | 347/8 |
| 2005/0153213 A1 * | 7/2005 | Schulze | .................... | G03F 1/32 |
| | | | | 430/5 |
| 2008/0107970 A1 * | 5/2008 | Tanabe | .................... | G03F 1/60 |
| | | | | 430/5 |
| 2008/0286528 A1 * | 11/2008 | Yoshioka | .............. | G02B 5/201 |
| | | | | 428/156 |
| 2010/0015876 A1 * | 1/2010 | Kang | ................. | H01L 27/3276 |
| | | | | 445/2 |
| 2011/0287682 A1 * | 11/2011 | Miyazawa | .......... | H01L 27/3246 |
| | | | | 445/2 |
| 2012/0228603 A1 * | 9/2012 | Nakamura | ............ | H01L 27/322 |
| | | | | 257/40 |
| 2014/0117341 A1 * | 5/2014 | Song | ................. | H01L 51/0097 |
| | | | | 257/40 |
| 2014/0346555 A1 * | 11/2014 | Verschuren | ......... | H01L 51/5259 |
| | | | | 257/100 |
| 2015/0028340 A1 * | 1/2015 | Iwasaka | ................ | H01L 27/124 |
| | | | | 257/72 |
| 2016/0087028 A1 * | 3/2016 | Hirota | ..................... | H01L 28/40 |
| | | | | 257/532 |
| 2016/0126498 A1 * | 5/2016 | Kim | ................... | H01L 51/5253 |
| | | | | 257/40 |
| 2016/0133677 A1 * | 5/2016 | Yamamoto | .......... | H01L 27/3246 |
| | | | | 257/40 |
| 2016/0190212 A1 * | 6/2016 | Takii | ..................... | H01L 27/322 |
| | | | | 257/40 |
| 2016/0376420 A1 * | 12/2016 | Yano | ........................ | C08K 5/12 |
| | | | | 524/297 |
| 2017/0012246 A1 * | 1/2017 | Onimaru | .............. | H01L 27/3246 |
| 2017/0040393 A1 * | 2/2017 | Onimaru | .............. | H01L 27/3246 |
| 2017/0077460 A1 * | 3/2017 | Hayashida | ............... | H01L 51/56 |
| 2017/0092896 A1 * | 3/2017 | Nakamura | .......... | H01L 51/5256 |
| 2017/0162831 A1 * | 6/2017 | Ito | ............................ | H01L 51/56 |
| 2017/0170244 A1 * | 6/2017 | Kobayashi | .......... | H01L 27/3246 |
| 2017/0179213 A1 * | 6/2017 | Takahashi | ............ | H01L 27/3272 |
| 2017/0213881 A1 * | 7/2017 | Kondo | ................ | H01L 27/3211 |

FOREIGN PATENT DOCUMENTS

| | | | | |
|---|---|---|---|---|
| JP | 2007-264186 | | 10/2007 | |
| JP | 2009-104030 | | 5/2009 | |
| JP | 2009104030 A | * | 5/2009 | |
| JP | 2010118362 A | * | 5/2010 | |
| JP | 2010-267576 | | 11/2010 | |
| JP | 2010267576 A | * | 11/2010 | |
| JP | 2011034930 A | * | 2/2011 | |
| WO | 2010/013654 | | 2/2010 | |
| WO | WO 2010013654 A1 | * | 2/2010 | ............ G02B 5/201 |
| WO | 2010/092765 | | 8/2010 | |
| WO | 2011/129283 | | 10/2011 | |

* cited by examiner

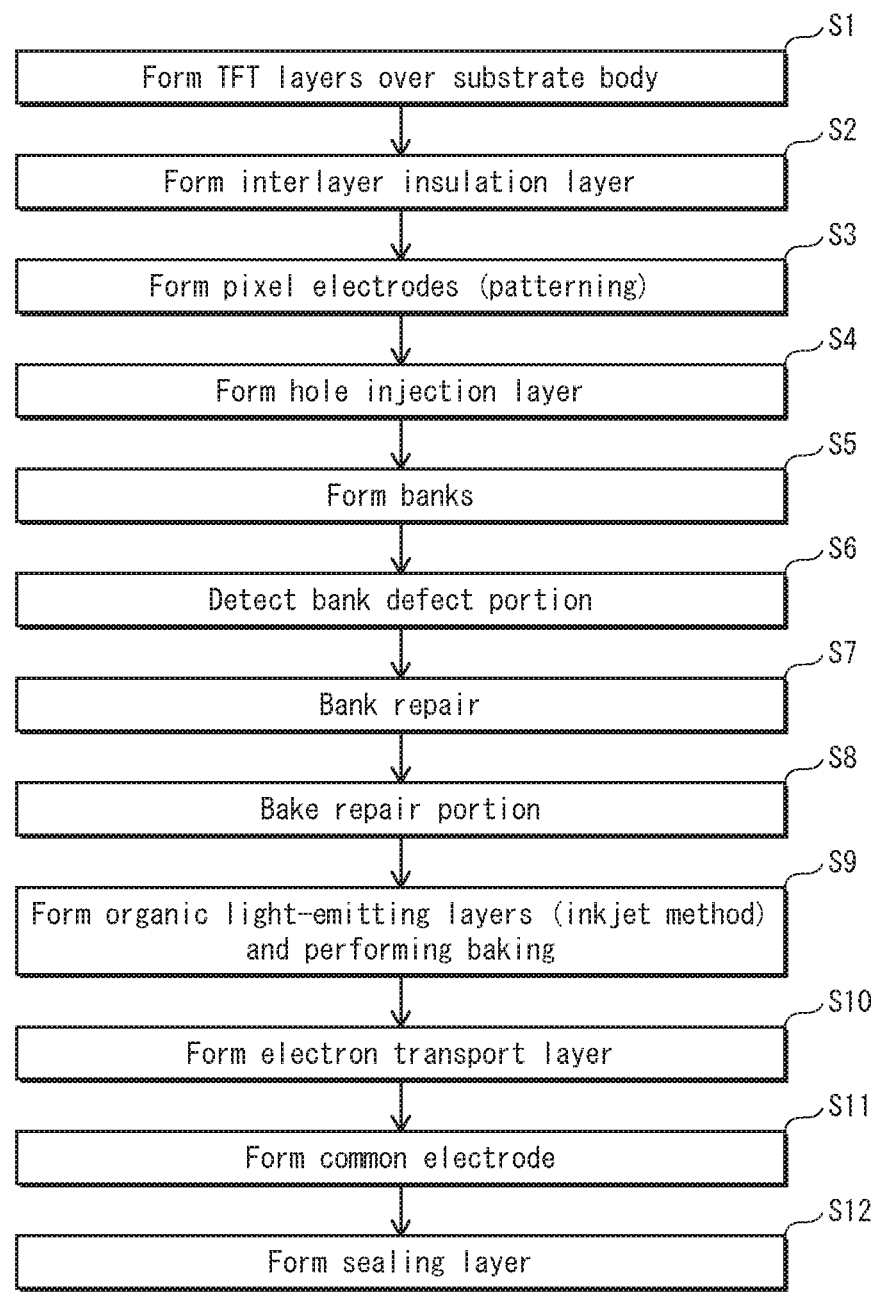

FIG. 5A Apply repair material
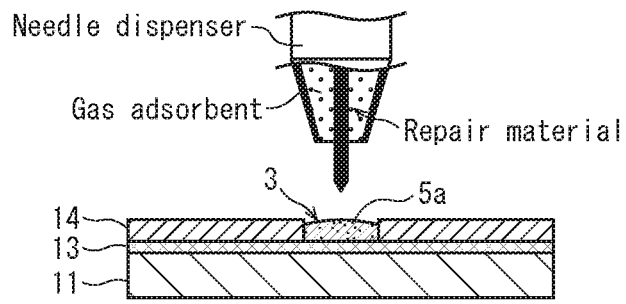
FIG. 5B Irradiation with UV light
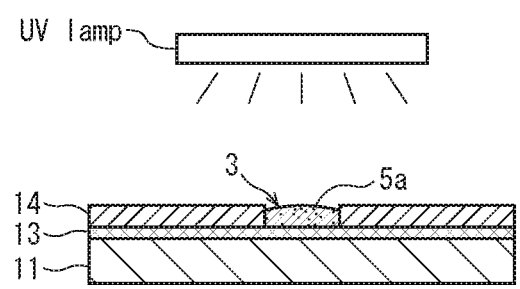
FIG. 5C Irradiation with infrared laser
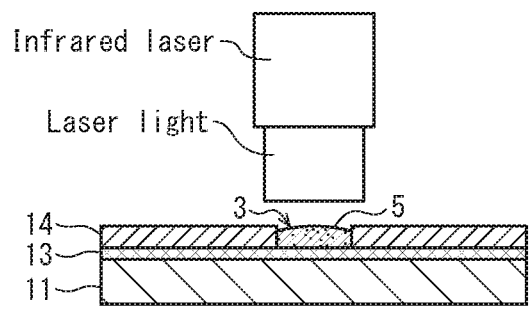

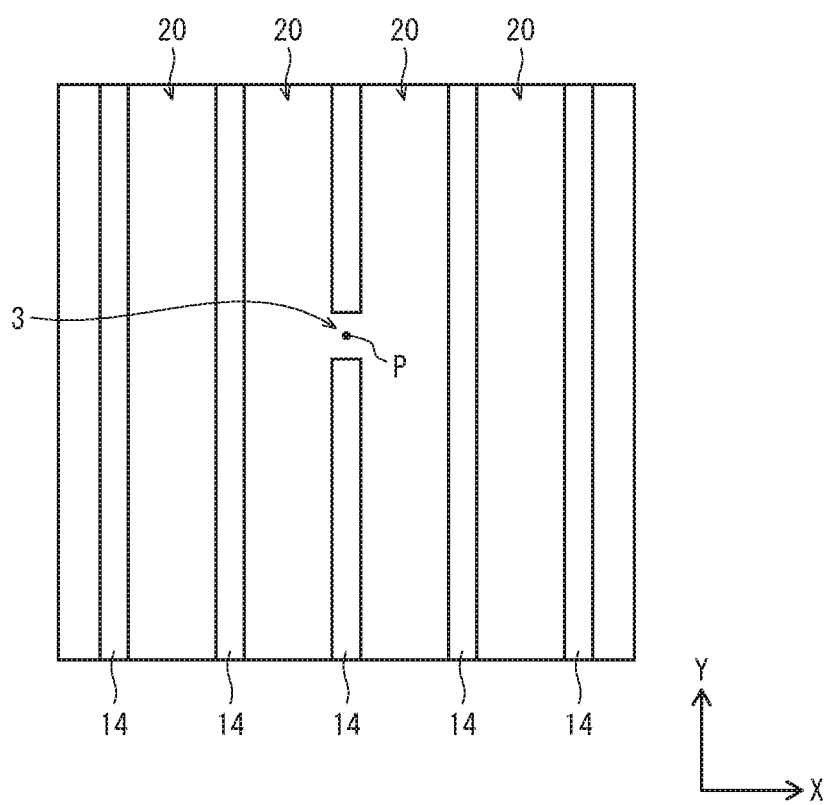

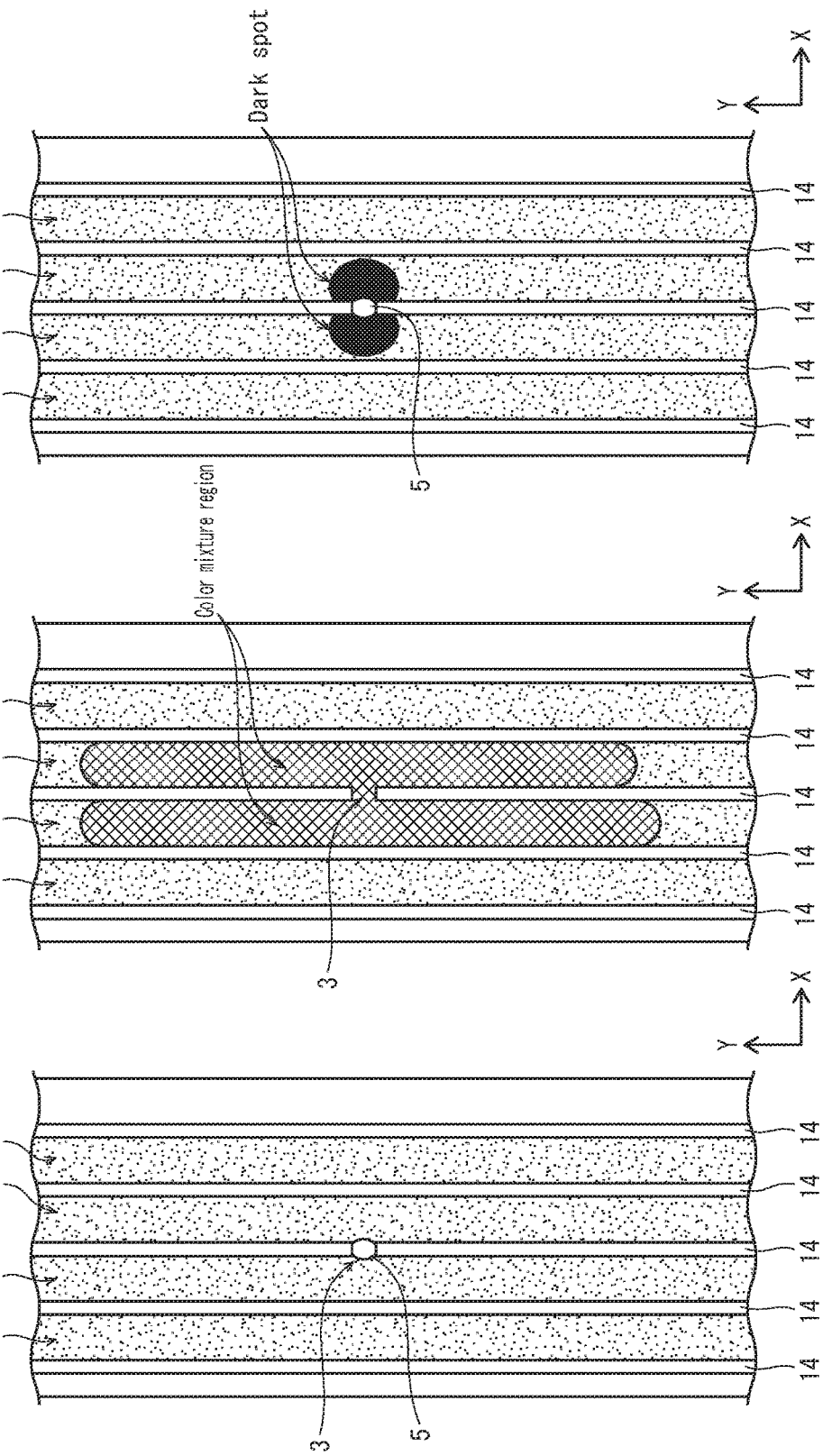

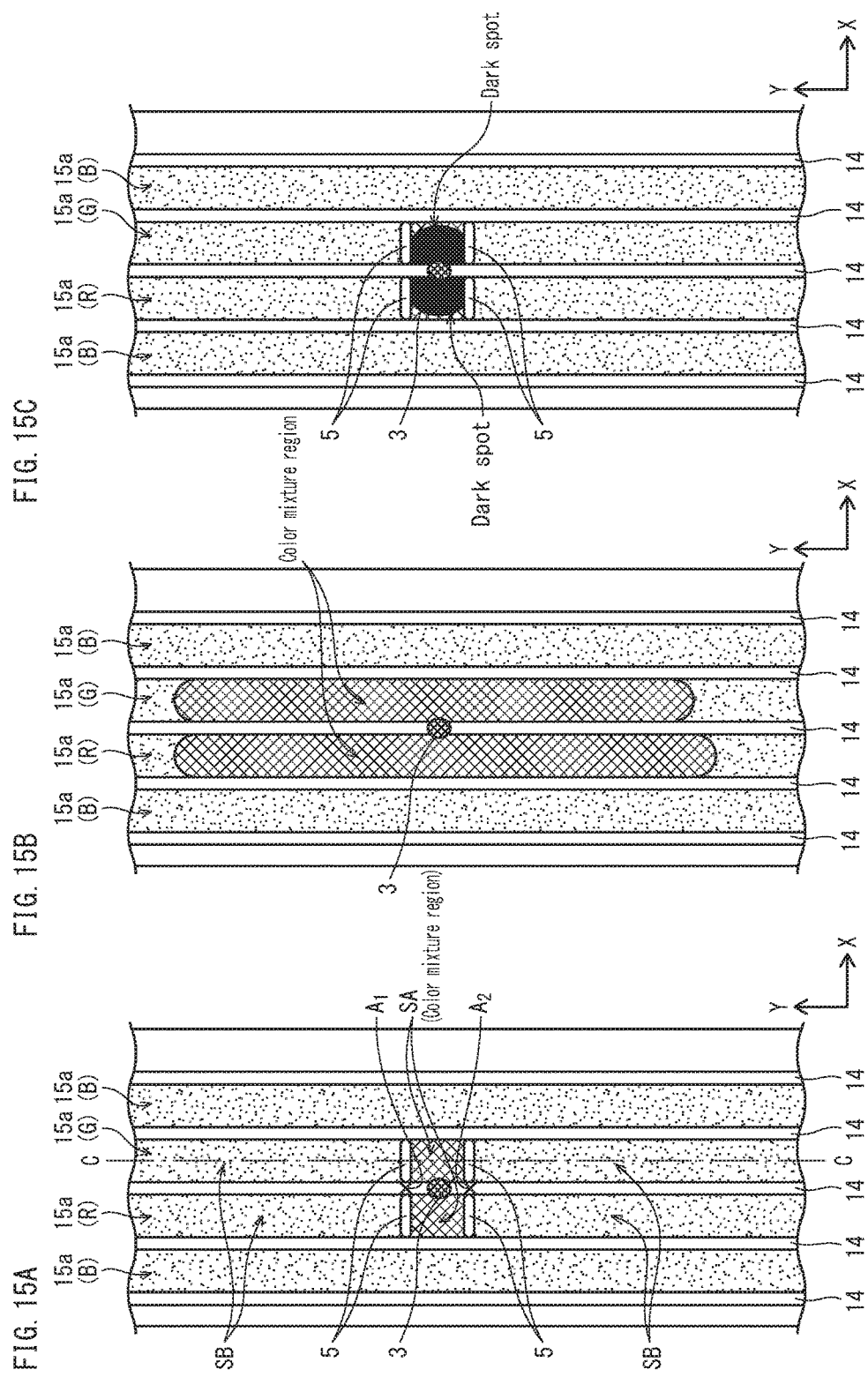

METHOD FOR REPAIRING BANK, ORGANIC EL DISPLAY DEVICE, AND METHOD FOR MANUFACTURING SAME

BACKGROUND ART

The present invention is related to a repair method of a bank in an organic electroluminescence (EL) element, an organic EL display device, and a manufacturing method for the organic EL display device. In particular, the present invention is related to a technology preventing the occurrence of display failures in an organic EL display device.

TECHNICAL FIELD

In recent years, organic EL display panels including a substrate and a matrix of organic EL elements arranged over the substrate have been put into practical use, as one type of a light-emitting display device. Such an organic EL display panel achieves high visibility due to the organic EL elements performing light emission individually. Also, such an organic EL display panel achieves excellent shock resistance due to the organic EL elements being completely solid-state elements.

Organic EL elements in a typical organic EL display panel have a basic structure in which a light-emitting layer containing an organic light-emitting material is disposed between an electrode pair composed of an anode and a cathode. The organic EL elements are driven through voltage application between these electrodes. The organic EL elements are current-driven light-emitting elements, emitting light when holes injected into the light-emitting layer from the anode and electrons injected into the light-emitting layer from the cathode recombine in the light-emitting layer.

Typically, a light-emitting layer of one organic EL element is partitioned from a light-emitting layer of an adjacent organic EL element by a bank formed by using an electrically-insulative material. In a full-color organic EL display panel, a plurality of organic EL elements having a structure as described above are disposed, and each organic EL element serves as a red sub-pixel, a green sub-pixel, or a blue sub-pixel. Further, each pixel of a full-color organic EL display panel is composed of a set of red, green, and blue sub-pixels disposed next to one another.

The manufacturing of such an organic EL display panel involves a process of forming light-emitting layers and so on in concave spaces defined by banks, after forming the banks on the substrate. The forming of the light-emitting layers is often performed through a wet process of applying, to the concave spaces, an ink containing a macro-molecular material or a low-molecular material suitable for forming a thin film, through an inkjet method or a similar method. Such a wet process enables organic layers, light-emitting layers, and the like to be formed relatively easily, even in large panels.

Meanwhile, if a bank having a defect portion is present, inks of different colors that are applied to different sides of the defect portion may mix via the defect portion (i.e., color mixture may occur). Here, the defect portion may be a missing portion of a bank or a portion of a bank where a foreign particle has adhered. When such color mixture occurs, the region where color mixture has occurred (referred to in the following as a color mixture region) emits light with an undesired color. This results in the occurrence of display failures in an organic EL display panel.

In view of this, as one example of a technology for repairing a bank having a defect portion, Patent Literature 1 discloses a technology of, after banks have been formed and before ink is applied, repairing a bank having a defect portion by applying a bank repair material containing an ink-repellent polymer to the defect portion and forming a repair portion.

CITATION LIST

Patent Literature

[Patent Literature 1]
  WO Publication No. 2010/013654

SUMMARY OF INVENTION

Technical Problem

However, actually repairing a bank by using the above-described technology has revealed that dark spots (i.e., areas that are supposed to emit light but do not emit light) may be formed in light-emitting layers near the repair portion. Such dark spots are not desirable, since they lead to the occurrence of display failures in organic EL display panels.

In view of this technical problem, the present invention aims to provide a bank repair method, an organic EL display device, and a manufacturing method for the organic EL display device that reduce the risk of dark spots being formed near a repair portion formed for repairing a bank.

Solution to Problem

One aspect of the present invention is a bank repair method for repairing a defect portion of a bank in a process of manufacturing an organic electroluminescence (EL) display device including a substrate, banks formed over the substrate, and light-emitting layers formed in concave spaces defined by the banks, the bank repair method including: examining whether or not a bank having a defect portion is present; and when a bank having a defect portion is present, repairing the bank by applying a repair material containing a gas adsorbent to the defect portion and curing the repair material; and after curing the repair material, baking the repair material by irradiating the repair material with infrared laser light.

Advantageous Effects of Invention

In the bank repair method pertaining to one aspect of the present invention, when a bank having a defect portion is present, the bank is repaired by applying a repair material containing a gas adsorbent with respect to the defect portion and curing the repair material, and after curing the repair material, the repair material is baked by irradiating the repair material with infrared laser light. Due to this, the risk is low of dark spots being formed near the repair portion formed for repairing the bank having the defect portion.

BRIEF DESCRIPTION OF DRAWINGS

FIG. 4 schematically illustrates procedures of manufacturing process of display panel 100.

Each of FIGS. 5A through 5C is a schematic cross-sectional view illustrating procedure of manufacturing process of display panel 100.

Figure 6A:
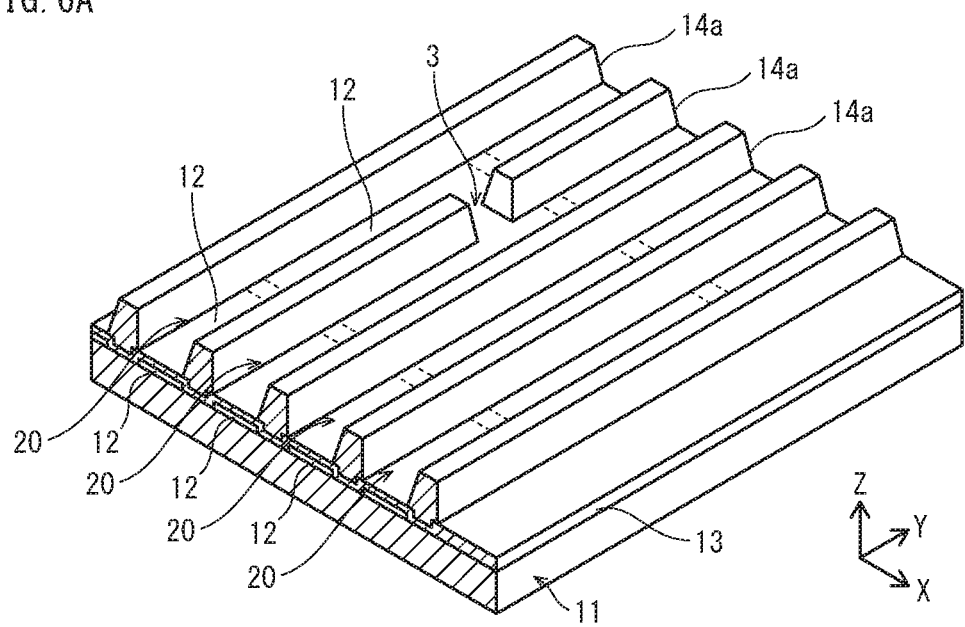
Figure 6B:
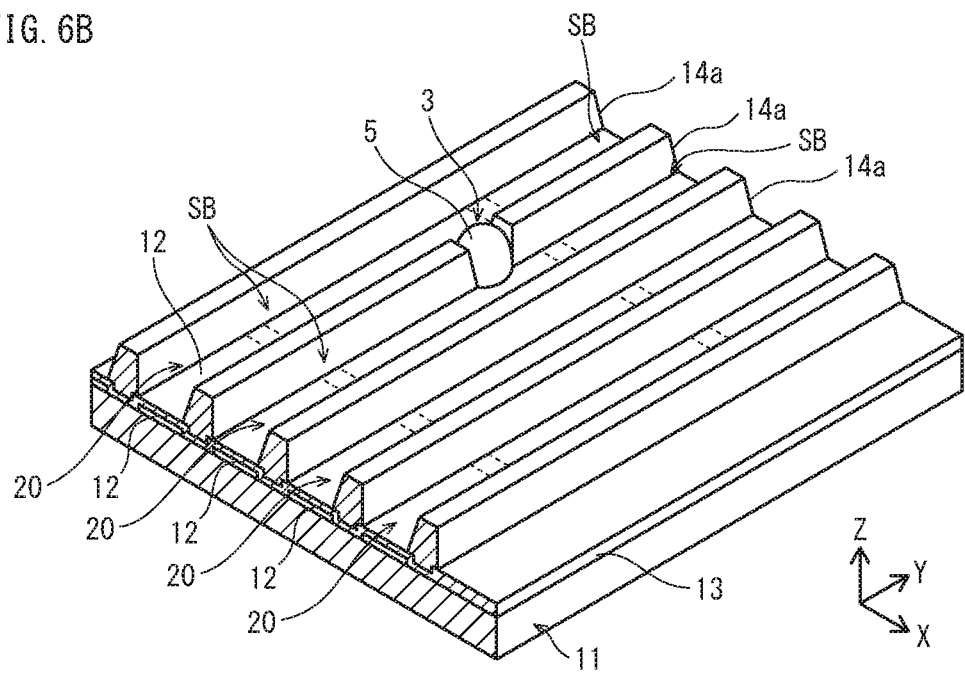

FIG. 6A is a perspective view illustrating example of bank defect portion, and FIG. 6B is a perspective view illustrating state where repair portion has been formed by applying repair material with respect to defect portion.

Figure 7:
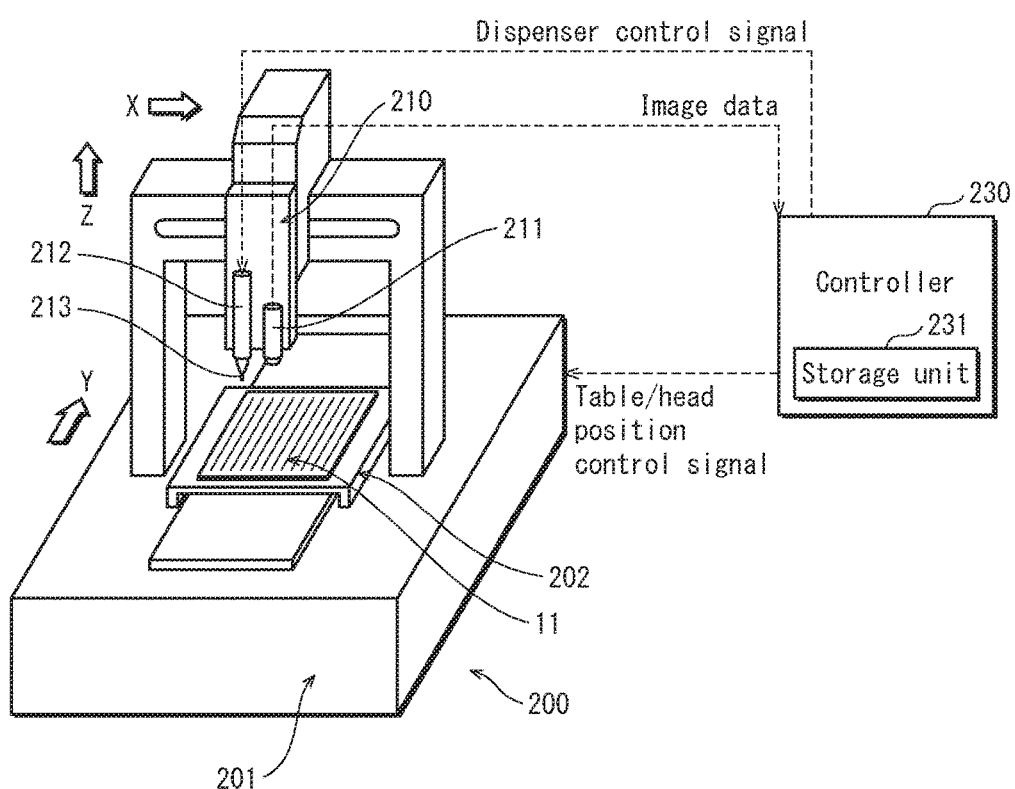

FIG. 7 illustrates overall structure of example of repair device used for detection and repair of bank defect portion.

FIG. 8 illustrates application position set in image around defect portion.

FIGS. 9A through 9D illustrate how repair portion is formed through application of repair material.

FIGS. 10A through 10C illustrate the effect achieved by forming repair portion pertaining to embodiment 1, with FIG. 10A illustrating case where repair portion is formed, FIG. 10B illustrating comparative example where repair portion is not formed, and FIG. 10C illustrating comparative example where repair portion is not baked.

Figure 11A:
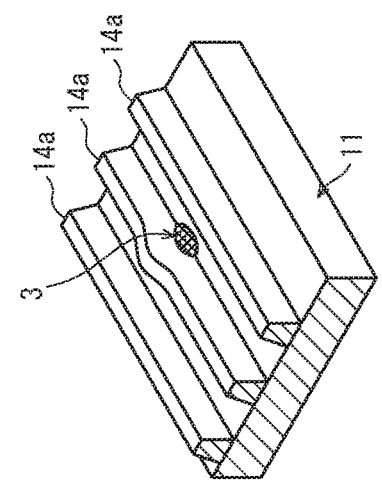
Figure 11B:
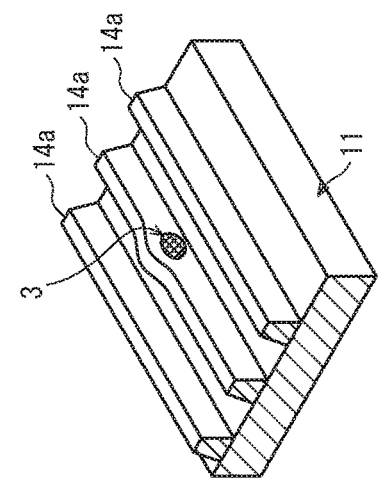
Figure 11C:
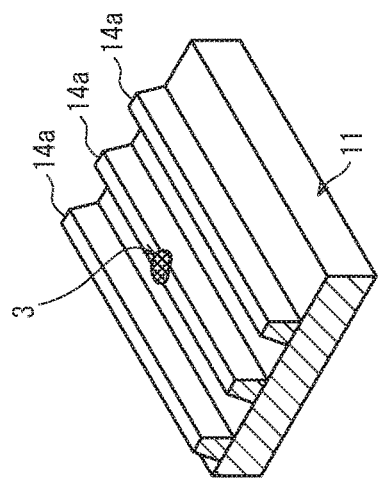

FIGS. 11A through 11C illustrate bank defect portions produced by foreign particles.

Figure 12:
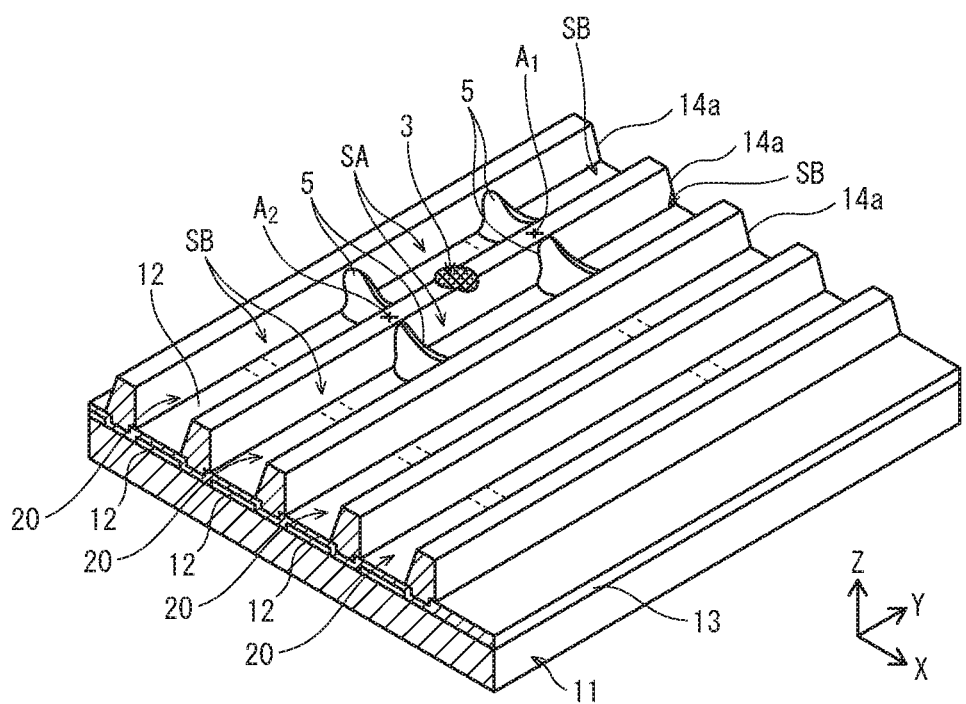

FIG. 12 is a perspective view illustrating example of bank defect portion.

Figure 13A:
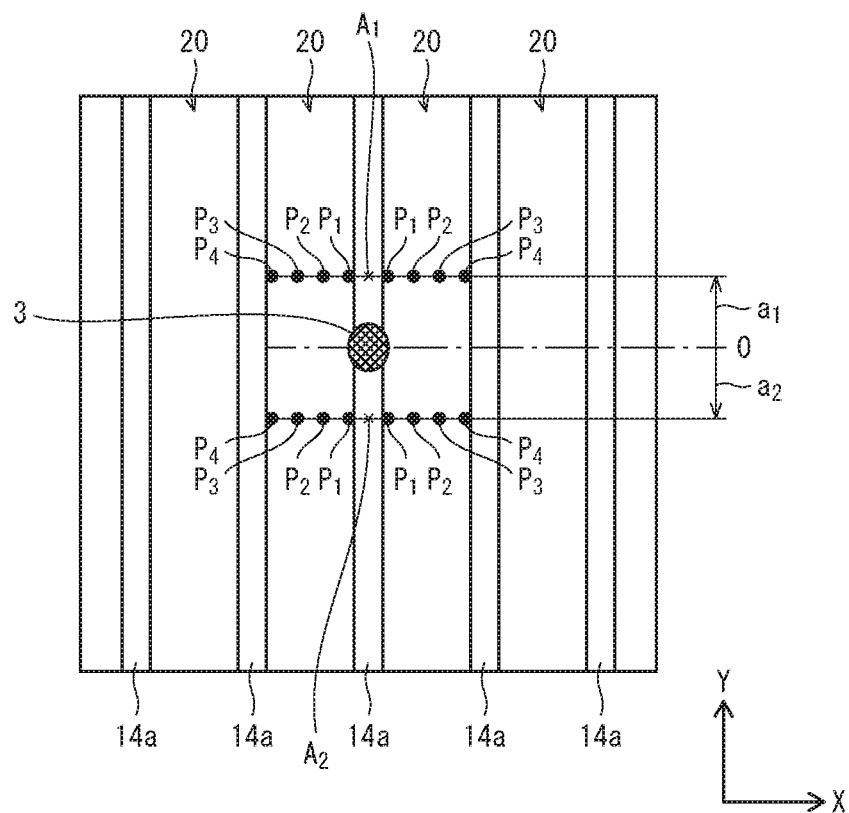
Figure 13B:
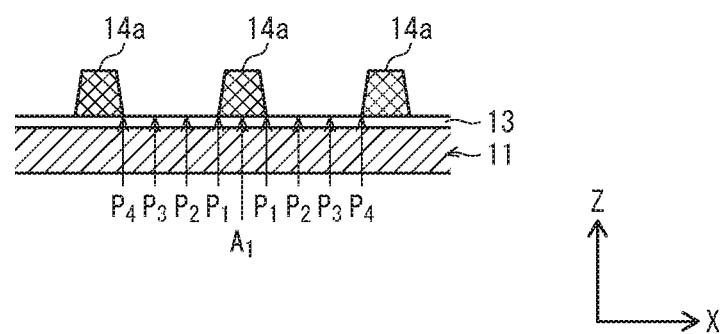

FIGS. 13A and 13B illustrate application positions set in image around defect portion.

Figure 14A:
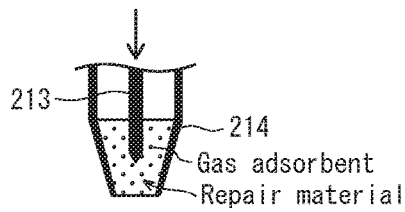
Figure 14B:
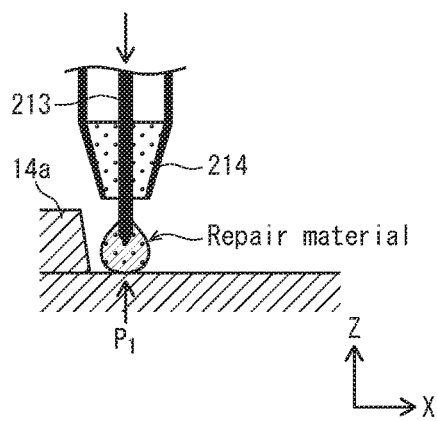
Figure 14E:
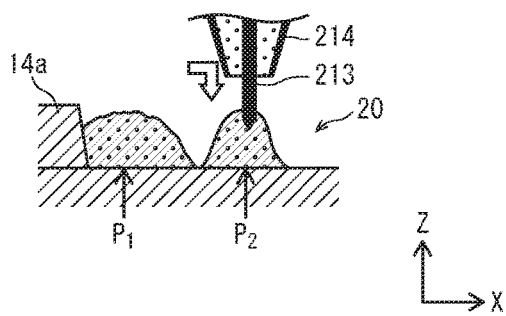
Figure 14C:
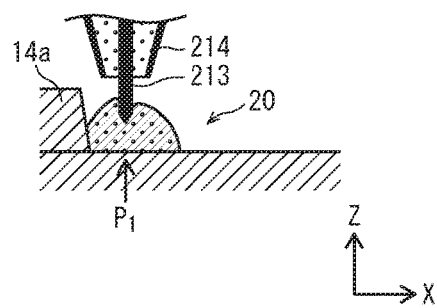
Figure 14F:
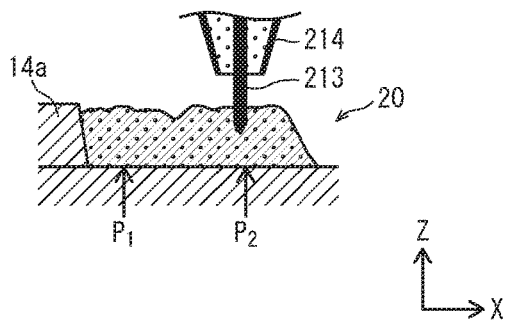
Figure 14D:
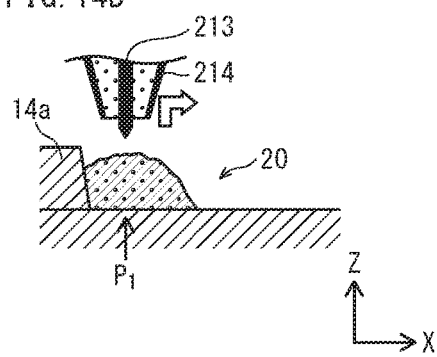
Figure 14G:
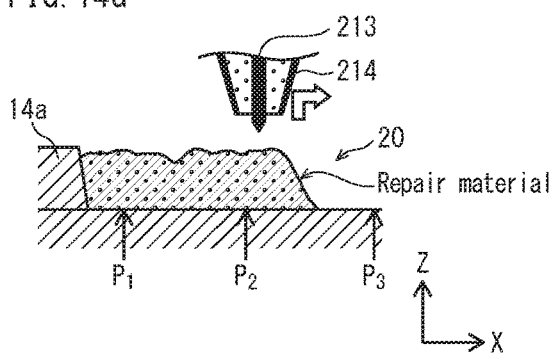

FIGS. 14 through 14G illustrate how repair portion is formed through application of repair material.

FIGS. 15A through 15C illustrate the effect achieved by forming repair portion pertaining to embodiment 1, with FIG. 15A illustrating case where repair portion is formed, FIG. 15B illustrating comparative example where repair portion is not formed, and FIG. 15C illustrating comparative example where repair portion is not baked.

DESCRIPTION OF EMBODIMENTS

Conception of Invention

When forming a repair portion to repair a defect portion of a bank, it is preferable that the repair portion have ink repellency as do the banks, because the repair portion needs to function as a part of a bank. This may be achieved by performing bank repair through applying bank material with respect to the defect portion as a repair material and forming a repair portion by curing the bank material so applied through exposure to ultraviolet light.

However, the present inventors have found that dark spots may be formed in light-emitting layers near a repair portion formed, for example, by using negative photolithography material. Further, the present inventors have found, through various considerations, that such dark spots are produced by discharge gas released to the outside from the repair portion when irradiation with ultraviolet light is performed to cure the bank material. Here, the term "discharge gas" is used to refer to gas-form byproducts produced from the bank material when irradiation with ultraviolet light is performed to cure the bank material. Dark spots are produced when discharge gas is released to the outside from the repair portion and reacts with material constituting the light-emitting layers near the repair portion.

In order to prevent dark spots from being produced, it is necessary to ensure that the repair portion does not release discharge gas once the light-emitting layers have been formed. This may be achieved, for example, by causing the repair portion to completely release discharge gas before the light-emitting layers are formed. Typically, bank baking is performed to cause banks to release discharge gas. Similar to this, baking of the repair portion may be performed to cause the repair portion to release discharge gas.

However, the present inventors have found that baking the banks twice, first for causing the banks to release discharge gas and then for causing the repair portion to release discharge gas, results in bank damage due to heat. Specifically, the present inventors have found that when banks are baked twice, problems such as a reduction in bank surface ink repellency, and bank deformation and a consequent change in bank taper angle may occur. Further, defect portions are also produced through bank baking, and the present inventors found that there were cases where, even if a defect portion found after performing baking for the first time had been repaired, a new defect portion was produced by performing baking for the second time.

Bank damage can be avoided by reducing the number of time baking is performed. In view of this, it is preferable that banks and repair portions be baked at the same time. However, baking may also produce defect portions, as already discussed above. Due to this, if performing baking only once to bake banks and repair portions at the same time, there would be no way of repairing a defect portion produced through the baking.

As such, the present inventors considered a method of baking only repair portions without baking banks, after repairing bank defect portions. Specifically, the present inventors focused on infrared laser light, which enables local heating, and thus have arrived at the technical concept of irradiating only repair portions with infrared laser light to bake only repair portions without baking banks.

In addition, assuming that there may be cases where irradiation with infrared laser light alone would not achieve baking sufficient for causing repair portions to completely release discharge gas, the present inventors have arrived at the technical concept of containing a gas adsorbent in repair portions and causing the gas adsorbent to adsorb discharge gas that is not released through the baking.

According to the bank repair method pertaining to one aspect of the present invention, the risk is low of the repair portion releasing discharge gas, due to the repair portion having been baked. Further, the baking for the repair portion is performed by irradiation with infrared laser light, and thus, the risk is low of the banks being heated during the baking. As such, the risk is low of problems such as bank deformation and decrease in bank ink repellency occurring. Further, due to the repair material applied with respect to the defect portion containing a gas adsorbent, any discharge gas that remains inside the defect portion even after the baking is adsorbed by the gas adsorbent. Thus, the bank repair method pertaining to one aspect of the present invention reduces the risk of discharge gas being released from the repair portion and reduces the risk of dark spots being formed in light-emitting layers near the repair portion.

Overview of Aspects of Present Invention

One aspect of the present invention is a bank repair method for repairing a defect portion of a bank in a process of manufacturing an organic electroluminescence (EL) display device including a substrate, banks formed over the substrate, and light-emitting layers formed in concave spaces defined by the banks, the bank repair method including: examining whether or not a bank having a defect portion is present; and when a bank having a defect portion is present, repairing the bank by applying a repair material containing a gas adsorbent to the defect portion and curing the repair material; and after curing the repair material, baking the repair material by irradiating the repair material with infrared laser light.

Specifically, in the bank repair method pertaining to one aspect of the present invention, the gas adsorbent is a physical gas adsorbent.

Specifically, in the bank repair method pertaining to one aspect of the present invention, the gas adsorbent is zeolite.

Specifically, in the bank repair method pertaining to one aspect of the present invention, the repair material is baked at a temperature between 180° C. and 240° C. through irradiation with the infrared laser light.

One aspect of the present invention is an organic electroluminescence (EL) display device including: a substrate; banks formed over the substrate; and light-emitting layers disposed in concave spaces defined by the banks, wherein a defect portion is present in the banks, and the defect portion has been repaired by using a repair material containing a gas adsorbent.

Specifically, in the organic EL display device pertaining to one aspect of the present invention, a height of a highest part of the repair portion is no higher than a height of the banks, and a height of a lowest part of the repair portion is no lower than 80% of the height of the banks.

One aspect of the present invention is a method for manufacturing an organic EL display device by forming banks over a substrate and forming light-emitting layers in concave spaces defined by the banks, the method including: examining whether or not a bank having a defect portion is present; when a bank having a defect portion is present, repairing the bank by applying a repair material containing a gas adsorbent with respect to the defect portion and curing the repair material; and after curing the repair material, baking the repair material by irradiating the repair material with infrared laser light; and forming the light-emitting layers after baking the repair material.

Embodiment 1

[Overall Structure of Organic EL Display Device]

Figure 1:
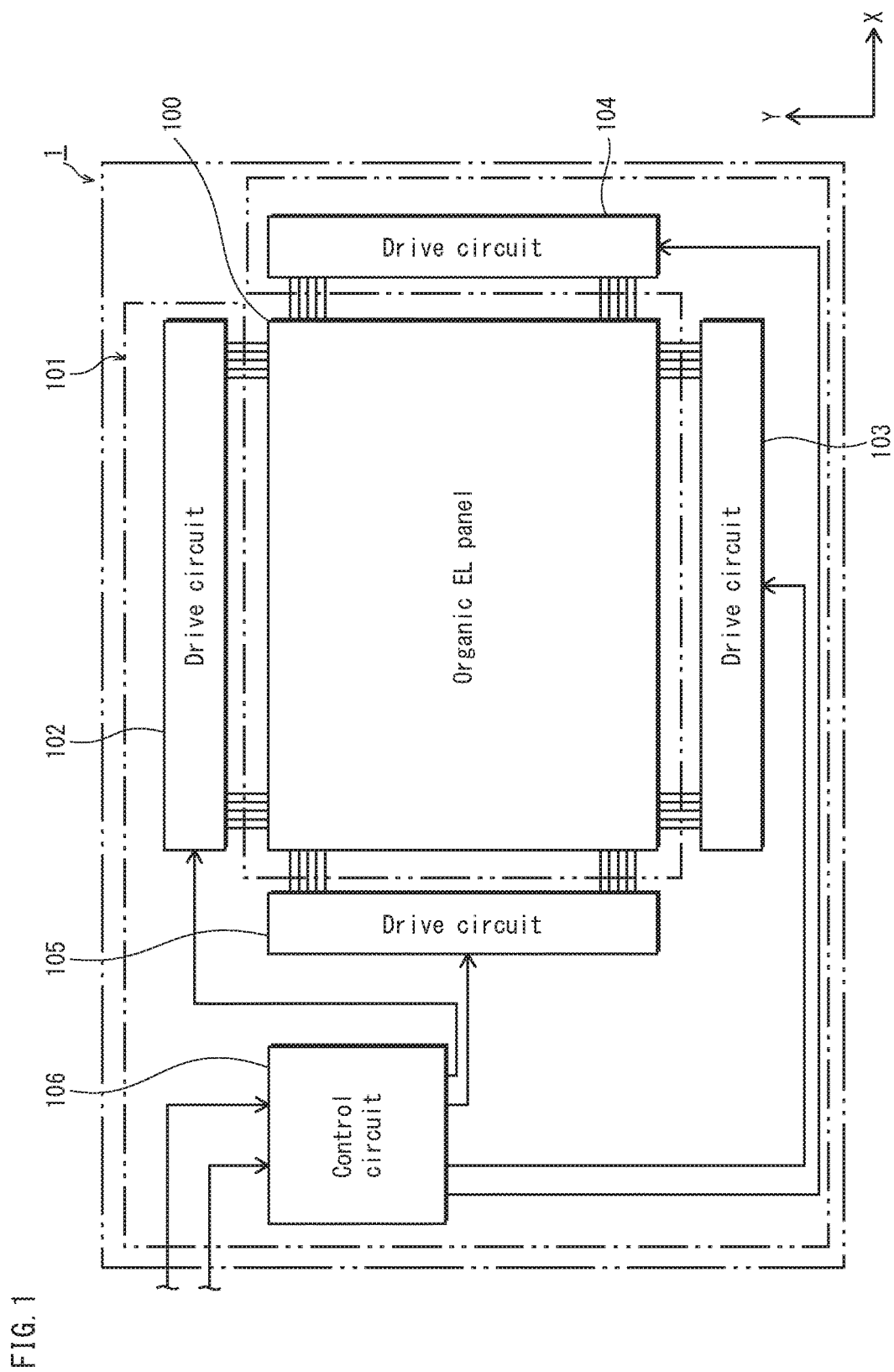
FIG. 1 is a schematic block diagram illustrating example of structure of organic EL display device 1.

FIG. 1 is a schematic block diagram illustrating the structure of an organic EL display device 1 having a display panel 100 pertaining to embodiment 1.

Figure 2:
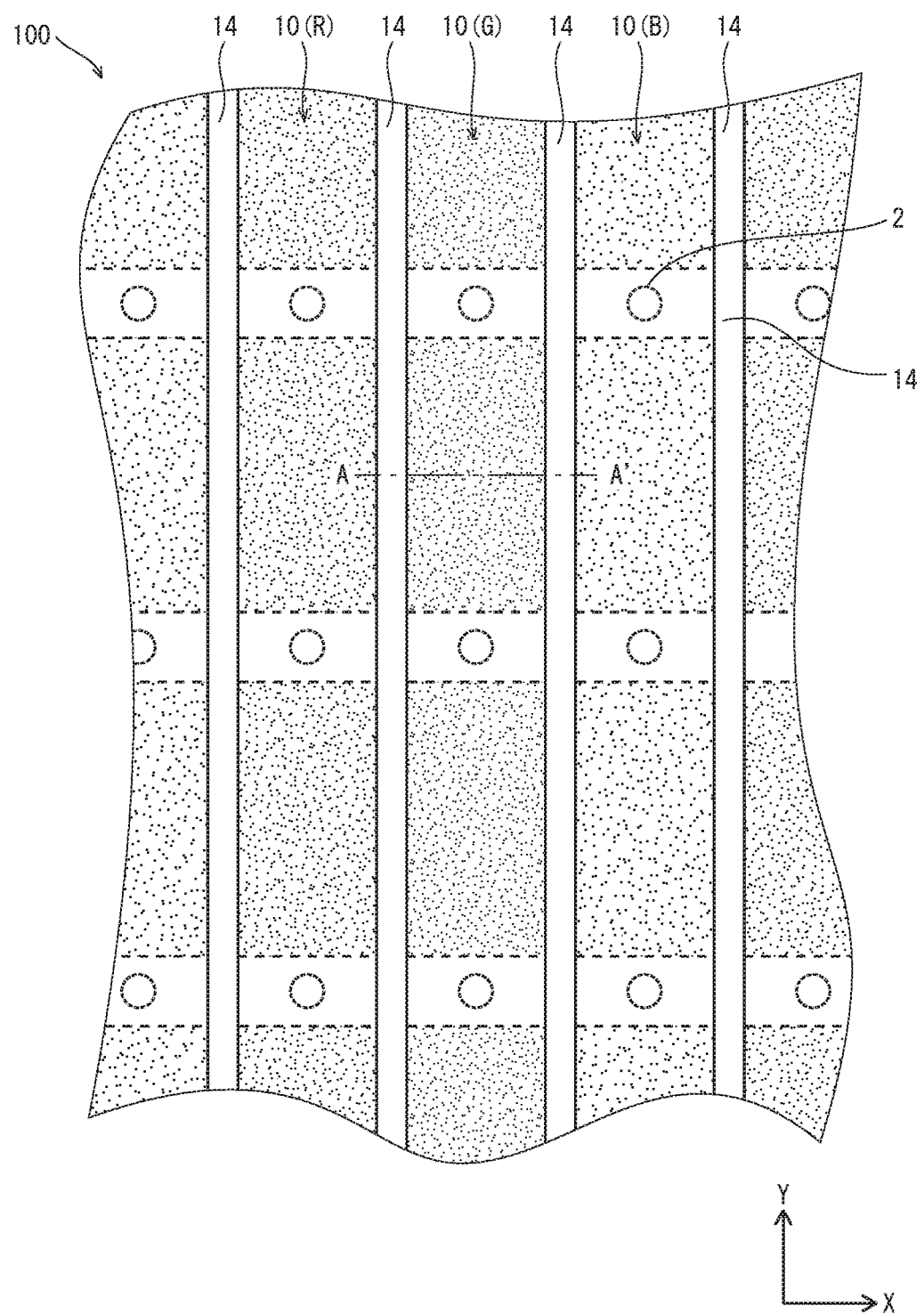
FIG. 2 is a plan view illustrating part of organic EL display panel 100.

As illustrated in FIG. 1, the organic EL display device 1 includes the display panel 100 and a drive controller 101 connected thereto. The display panel 100 is a panel using the electroluminescence effect of an organic material. In the display panel 100, a plurality of organic EL elements 10 are arranged over a substrate to form a matrix, as illustrated in FIG. 2. The drive controller 101 includes four drive circuits, namely drive circuits 102, 103, 104, and 105, and a control circuit 106.

The arrangement of the drive controller 101 with respect to the display panel 100 is not limited to that illustrated in FIG. 1.

[Structure of Organic EL Display Panel]

Figure 3:
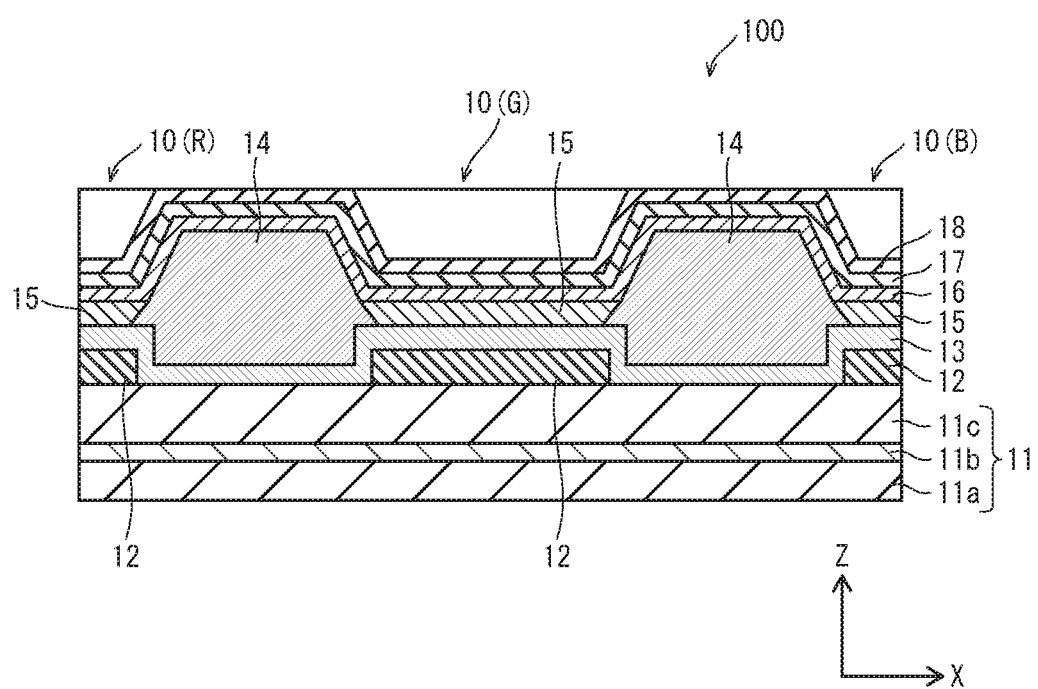
FIG. 3 is a cross-sectional view illustrating part of the display panel 100 taken along line A-A' of FIG. 2, in magnified state.

FIG. 2 is a plan view schematically illustrating the overall structure of the display panel 100, when viewed from above a display surface thereof. FIG. 3 is a cross-sectional view illustrating a part of the display panel 100 taken along line A-A' of FIG. 2, in magnified state. The display panel 100 is a top-emission-type panel, and the display surface of the display panel 100 is located in the Z direction in FIG. 3.

The following describes the structure of the display panel 100, with reference to FIGS. 2 and 3.

As illustrated in FIG. 3, the display panel 100 includes, as main components thereof, a ground substrate 11, pixel electrodes 12, a hole injection layer 13, banks 14, organic light-emitting layers 15, an electron transport layer 16, a common electrode 17, and a sealing layer 18. Also, each of the organic EL elements 10 includes an organic light-emitting layer 15 of a color corresponding to the light-emission color of the organic EL element 10, which is either red (hereinafter, R), green (hereinafter, G), or blue (hereinafter, B). Each organic EL element 10 serves as a sub-pixel. As illustrated in FIG. 2, the sub-pixels are arranged to form a matrix.

FIG. 2 illustrates a state where the electron transport layer 16, the common electrode 17, and the sealing layer 18 are removed.

[Ground Substrate]

The ground substrate 11 includes a substrate body 11a, thin-film transistor (TFT) layers 11b, and an interlayer insulation layer 11c.

The substrate body 11a serves as the base of the display panel 100, and may be formed by using, for example, an electrically-insulating material such as non-alkali glass, soda glass, polycarbonate resin, polyester resin, or aluminum oxide.

The TFT layers 11b are provided one-to-one for sub-pixels of the display panel 100, on the surface of the substrate body 11a. Each TFT layer 11b has formed therein a pixel circuit that includes a TFT element.

The interlayer insulation layer 11c is formed on the TFT layers 11b. The interlayer insulation layer 11c is formed by using an organic electrically-insulating material such as a polyimide resin, an acrylic resin, or a novolac-type phenol resin, or an inorganic electrically-insulating material such as SiO (silicon oxide) or SiN (silicon nitride). The interlayer insulation layer 11c secures electrical insulation between the TFT layers 11b and the pixel electrodes 12. In addition, the interlayer insulation layer 11c planarizes any level difference on the top surfaces of the TFT layers 11b, and thereby suppresses the influence that such level differences would otherwise have with respect to the surface on which the pixel electrodes 12 are formed.

[Pixel Electrodes]

The pixel electrodes 12 are provided one-to-one for sub-pixels of the display panel 100, and are formed by using an optically-reflective electrically-conductive material, such as Ag (silver), Al (aluminum), aluminum alloy, Mo (molybdenum), or APC (an alloy of silver, palladium, and copper). In the present embodiment, the pixel electrodes 12 serve as anodes.

A conventional light-transmissive electrically-conductive film may be additionally provided on the surface of each pixel electrode 12. This light-transmissive electrically-conductive film may be formed, for example, by using indium tin oxide (ITO) or indium zinc oxide (IZO). The light-transmissive electrically-conductive films are disposed between the pixel electrodes 12 and the hole injection layer 13, and improve inter-layer joining.

[Hole Injection Layer]

The hole injection layer 13 is formed, for example, by using an oxide of a metal such as silver (Ag), molybdenum (Mo), chromium (Cr), vanadium (V), tungsten (W), nickel (Ni), or iridium (Ir), or an electrically-conductive polymer material such as PEDOT (a mixture of polythiophene and polystyrene sulfate). The hole injection layer 13, when formed by using a metal oxide, assists hole generation and ensures stable injection and transportation of holes to the organic light-emitting layers 15.

[Banks]

A plurality of parallel, linear banks 14 are provided on the surface of the hole injection layer 13. In plan view, each of the banks 14 is elongated and extends in the Y direction (first direction), and has a rectangular shape. The banks 14 are formed by using an organic electrically-insulative material (for example, an acrylic resin, a polyimide resin, or a novolac-type phenol resin).

As illustrated in FIG. 3, each of the banks 14 has a trapezoidal cross-section. Further, the banks 14 define therebetween groove spaces that accommodate the organic light-emitting layers 15.

The banks 14 serve as structural members that, when a wet process is performed for forming the organic light-emitting layers 15, prevent applied ink from overflowing.

[Organic Light-Emitting Layers]

The organic light-emitting layers 15 emit light through recombination of carriers (i.e., holes and electrons) occurring therein, and each contain an organic material corresponding to one of the colors R, G, and B.

The organic light-emitting layers 15 are disposed in the concave spaces (refer to the groove spaces 20 illustrated in FIG. 6A and FIG. 6B) partitioned from one another by the banks 14, are elongated and extend in the Y direction, and have groove-like shapes.

As such, each bank 14 is disposed between two organic light-emitting layers 15, which differ in terms of color.

The organic light-emitting layers 15 may be formed, for example, by using a fluorescent substance such as polyphenylene vinylene (PPV), polyfluorene, oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, or rare earth metal complex.

[Electron Transport Layer]

The electron transport layer 16 transports electrons injected thereto from the common electrode 17 to the organic light-emitting layers 15, and is formed by using, for example, an oxidiazole derivative (OXD), a triazole derivative (TAZ), or a phenanthroline derivative (BCP, Bphen).

[Common Electrode]

The common electrode 17 is, for example, formed by using a light-transmissive material having electrically-conductive properties, such as ITO or IZO. The common electrode 17 extends across all sub-pixels of the display panel 100.

In the present embodiment, the common electrode 17 serves as a cathode.

[Sealing Layer 18]

The sealing layer 18 is disposed to protect the hole injection layer 13, the organic light-emitting layers 15, the electron transport layer 16, and the common electrode 17 from water and oxygen.

Although not depicted in the drawings, black matrices, color filters, and/or the like may also be formed over the sealing layer 18.

[Display Panel Manufacturing Method]

FIG. 4 schematically illustrates procedures of a manufacturing process of the display panel 100.

Each of FIGS. 5A through 5C is a schematic cross-sectional view illustrating a procedure of the manufacturing process of the display panel 100.

The manufacturing method of the display panel 100 is described in accordance with FIG. 4, which illustrates the procedures involved in the manufacturing process, and with further reference to FIG. 3 and FIGS. 5A through 5C.

First, the TFT layers 11b are formed on the substrate body 11a (Step S1).

Subsequently, the interlayer insulation layer 11c is formed on the TFT layers 11b by using an organic material providing excellent electrical insulation and through a photoresist method, with which the preparation of the ground substrate 11 is completed (Step S2). The thickness of the interlayer insulation layer 11c is approximately 4 μm, for example. Although not depicted in the cross-sectional view of FIG. 3 nor in FIG. 4, which illustrates the procedures involved in the manufacturing process, contact holes 2 (see FIG. 2) are also formed during the forming of the interlayer insulation layer 11c.

Next, the pixel electrodes 12 are formed, one for each sub-pixel, from a metallic material having a thickness of approximately 400 nm, through vacuum vapor deposition or sputtering (Step S3).

Then, the hole injection layer 13 is formed by uniformly forming a film of tungsten oxide over the ground substrate 11 and the pixel electrodes 12 through sputtering or the like (Step S4).

Next, the banks 14 are formed (Step S5). The banks 14 are formed through photolithography, as described in the following.

First, bank material (a negative photosensitive resin composition) is prepared and applied uniformly over the hole injection layer 13. Then, bank patterning is performed by placing a mask having openings matching the pattern of the banks 14 over the layer of the applied bank material, and performing irradiation with light from over the mask. Uncured banks 14 are yielded when the patterning is completed by washing away any excess bank material with an alkaline developing fluid. At this point, a groove space 20 has already been formed between each pair of adjacent banks 14. Subsequently, the banks 14 are yielded by performing irradiation with ultraviolet light and thereby curing the banks 14.

Then, baking of the banks 14 is performed, which causes the banks 14 to release discharge gas. The baking is, for example, performed by heating the bank 14 at a temperature between 180° C. and 240° C. for 60 minutes.

Here, note that while the irradiation with ultraviolet light temporarily reduces the ink repellency of the banks 14, the baking causes the ink repellency of the banks 14 to increase once again. The present inventors assume that this increase in ink repellency is a result of the baking causing fluorine contained inside the banks 14 to emerge to the surface portions of the banks 14.

The banks 14 formed in this manner may be further subjected to a process of adjusting contact angle with respect to ink to be applied in the subsequent process. Alternatively, in order to provide the surfaces of the banks 14 with ink repellency, processing such as surface processing using a predetermined alkaline solution, water, an organic solvent, etc., or plasma processing may be applied.

Subsequently, the banks 14, formed through the above-described patterning, are examined to detect defect portions 3 (Step S6).

Then, any bank 14 having a defect portion 3 is repaired (Step S7).

A bank defect portion 3 may, for example, be a missing portion of a bank or a portion of a bank where a foreign particle has adhered. In embodiment 1, a defect portion 3 refers to a missing portion of a bank. Further, a bank having a defect portion 3 is repaired by forming a repair portion 5 inside the defect portion 3.

First, as illustrated in FIG. 5A, repair material is applied inside the defect portion 3, whereby an uncured repair portion 5a is formed inside the defect portion 3. While the details of the application of the repair material are described later, for example, a repair material containing a gas adsorbent is applied by using a needle dispenser.

Subsequently, the uncured repair portion 5a is irradiated with ultraviolet light and cured, as illustrated in FIG. 5B. This irradiation with ultraviolet light is performed, for example, by using an ultraviolet lamp. Thus, a repair portion 5 is formed with respect to the defect portion 3, and the repair of a bank 14 having a defect portion 3 is completed.

Subsequently, baking of the repair portion 5, which is constituted of cured repair material, is performed as illustrated in FIG. 5C, to cause the repair portion 5 to release discharge gas to the outside (Step S8). While the details of the baking of the repair portion 5 are described later, for example, the baking is performed by using infrared laser light and so that only the repair portion 5 is irradiated with the infrared laser light.

Further, in order to provide surfaces of the repair portion 5 so yielded with ink repellency, processing such as surface processing using a predetermined alkaline solution, water, an organic solvent, etc., or plasma processing may be applied.

Next, inks for forming the organic light-emitting layers 15 are applied with respect to the groove spaces 20 between the banks 14. Each ink is a mixture of an organic material for the corresponding organic light-emitting layers 15 and a solvent, and is applied with respect to the inside of groove spaces 20 using an inkjet method. Subsequently, by performing drying to cause ink solvent to evaporate and performing baking when necessary, the organic light-emitting layers 15 are formed in the groove spaces 20 (Step S9).

Next, the electron transport layer 16 is formed over the organic light-emitting layers 15 and the banks 14 by depositing a film of a material for the electron transport layer 16 through vacuum vapor deposition (Step S10).

The common electrode 17 is then formed by depositing a film of a material such as ITO or IZO through sputtering or the like (Step S11).

Then, the sealing layer 18 is formed by depositing a film of a light-transmissive material such as SiN or SiON over the surface of the common electrode 17 through sputtering, CVD, or the like (Step S12).

The manufacturing of the display panel 100 is completed through the above-described procedures.

[Method for Detecting and Repairing Bank Defect Portion]
[Defect Portion 3]

First, a defect portion 3 of a bank 14 is described.

FIG. 6A illustrates an example where a portion of one bank 14 has been lost and has become a defect portion 3. A portion of a first bank 14 may be lost in such a manner, for example, when a portion of a bank material layer not having undergone sufficient polymerization in the bank material layer light exposure process, due to not being exposed to enough light, is washed away during the subsequent developing process. Note that there are cases where such loss of a portion of a bank 14 is not tangible (is not revealed) until the banks 14 are baked.

When a portion of a bank 14 has been lost, the portion of the bank 14 is missing or has lower height than the rest of the bank 14. When a portion of a bank 14 has been lost, inks of different colors that are applied to different sides of the portion may mix via the portion, resulting in the occurrence of a color mixture region. When the display panel 100 is manufactured using a panel whose light-emitting layer has a color mixture region, the color mixture region emits light of a color differing from the originally intended color. Typically, when fluorescent substances of different light-emission colors are mixed, the light-emission color having longer wavelength becomes dominant.

For example, a color mixture region produced through mixing of red ink and green ink, such as the color mixture region illustrated in FIG. 10B, emits red light. Accordingly, a color mixture region formed in a region intended to emit green light turns out to emit red light, and thus, when the color mixture region spreads, light-emission color failure may occur.

As described above, mixture of inks of different light-emission colors occurs at a portion of a bank 14 that has been lost, and the mixture of such inks may lead to light-emission color failure. As such, such portions of banks 14 are referred to as defect portions 3.

[Detection of Defect Portion 3]

The detection of a defect portion 3 of a bank 14 is performed by, for example, capturing an image of the surfaces of the banks 14 formed over the ground substrate 11, and performing a pattern search on the image.

FIG. 7 illustrates the overall structure of one example of a repair device used for detecting and repairing bank defect portions.

The repair device illustrated in FIG. 7 (repair device 200) includes a base 201, and a table 202 and a head portion 210 over the base 201. The table 202 is a table on which the ground substrate 11 is placed. The head portion 210 has attached thereto an image capture element 211 and a dispenser 212. The table 202 is moveable along the Y direction in accordance with an instruction from a controller 230. The head portion 210 is likewise moveable along the X direction and the Z direction in accordance with an instruction from the controller 230.

Accordingly, in accordance with an instruction from the controller 230, the image capture element 211 and the dispenser 212, which are attached to the head portion 210, are capable of moving above the ground substrate 11 and in the X direction, the Y direction, and the Z direction relative to the ground substrate 11, which is placed on the table 202.

Using the repair device 200, image data of a top surface of the ground substrate 11 is acquired as the image capture element 211 is moved along the top surface of the ground substrate 11. The image data is stored in a storage unit 231 of the controller 230.

The controller 230 compares portions of banks 14 in the image data one after another, and detects differences between the banks 14 as defect portions 3. Then, upon detecting a defect portion 3, the controller 230 stores coordinate data (a coordinate value in the X direction and a coordinate value in the Y direction) of the defect portion 3 so detected in the storage unit 231.

During this detection process, there is a possibility of defect portions 3 being detected in several of the banks 14 formed over the ground substrate 11, and also there is a possibility of no defect portion 3 being detected in any of the banks 14.

When any bank 14 having a defect portion 3 is detected, the bank 14 is repaired.

[Repair Material]

For example, the repair material may be any resin composition that hardens when exposed to light, heat, or the like. The resin may be, for example, a curable resin containing an ethylene double bond, such as a (meth) acryloyl group, an aryl group, a vinyl group, or a vinyloxy group.

Also, a cross-linking agent, such as an epoxy compound or a polyisocyanate compound, that forms a cross-link with the resin may also be contained in the repair material as an additive.

The resin in the repair material may be a fluoride polymer, in which fluoride atoms are included in the resin structure. Using resin including fluoride atoms as the resin material provides ink repellency to repair portions 5 formed by using the repair material. Alternatively, various ink repelling agents may be added to the resin. In any case, the content of the ink repelling agent should be between 0.01 wt % and 10 wt %. Adding an ink repelling agent by an amount within this range ensures that the resin compound is stable during storage, and also provides repair portions 5 formed by using the repair material with high ink repellency.

The repair material contains a gas adsorbent.

Accordingly, a repair portion 5 that is formed also contains the gas adsorbent in scattered state. Hence, even if the release of discharge gas from the repair portion 5 is not complete due to the baking of the repair portion 5 being insufficient, discharge gas remaining inside the repair portion 5 is adsorbed by the gas adsorbent and is not released to the outside.

It is preferable that the gas adsorbent is an adsorbent that does not react with discharge gas. Specifically, physical gas adsorbents are preferable for low risk of reacting with discharge gas. Examples of physical gas adsorbents include natural and synthesized zeolite. Zeolite, with a high adsorption speed, adsorbs discharge gas at high speed.

Examples of physical gas adsorbents other than zeolite include: activated carbon; activated carbon fiber; activated alumina; activated clay; sepiolite; iron compounds such as iron oxide; zinc oxide; magnesium oxide; silica; silica/zinc oxide composites; silica/alumina/zinc oxide composites; composite phyllosilicate; and apatite. Further, such materials can be used in combination with one another. Further, the gas adsorbent need not necessarily be a physical gas adsorbent, and may by a chemical gas adsorbent.

It is preferable that gas adsorbent content in the repair material is 5% to 20% by weight. When the gas adsorbent content in the repair material is smaller than 5% by weight, discharge gas cannot be adsorbed to a sufficient extent. Meanwhile, when the gas adsorbent content in the repair material is greater than 20% by weight, a repair portion 5 formed by using the repair material would not have a sufficient level of ink repellency.

Also, the bank material used for forming the banks 14 may be used to prepare the repair material. Specifically, the repair material may be prepared by dispersing the gas adsorbent in the bank material. Here, it should be noted that bank material typically includes an acid component that is soluble to an alkaline developing fluid. However, it is preferable that the repair material for forming repair portions 5 does not include such an acid component. This is because developing is not performed in the forming of a repair portion 5, and accordingly, acid component remaining in the repair portion 5 would provide the repair portion 5 with low resistance to solvents.

Further, the resin composition in the repair material may contain a solvent and a photopolymerization initiator as additives, when necessary.

The solvent is a solvent dissolving the resin, and one or more solvents having a boiling point approximately within the range between 150° C. and 250° C. may be used.

The photopolymerzation initiator may be any type of photopolymerization initiator available on the market.

Further, upon the application of the repair material, the repair material is adjusted so that the content of solid components in the repair material is between, for example, 20 wt % and 90 wt %, and the repair material has a viscosity between, for example, 10 cP and 50 cP (where cP is the unit centipoise). In order to ensure that the gas adsorbent is scattered uniformly within repair portions 5, it is preferable that the repair material be adjusted to have a viscosity between 10 cP and 20 cP.

[Bank Repair]

Next, a bank 14 having a defect portion 3 is repaired by causing the dispenser 212 to apply the repair material for forming repair portions over the ground substrate 11 mounted on the table 202 so as to fill the defect portion 3 and thereby forming a repair portion 5.

Here, the repair portion 5 is formed at the defect portion 3, as illustrated in FIG. 6B.

Figure 9A:
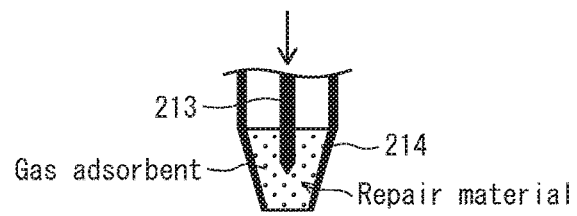

The dispenser 212 of the repair device 200 is a needle dispenser. The dispenser 212 has a tank 214 attached at a tip portion thereof. The tank 214 stores the repair material. The dispenser 212 is capable of applying the repair material in microliter units by moving a needle 213 up and down through the tank 214 to cause the repair material to adhere to the needle 213, as illustrated in FIG. 9A.

The needle 213 of the dispenser 212 is driven in accordance with a control signal from the controller 230, as illustrated in FIG. 7.

The controller 230 of the repair device 200 stores image data of the banks 14 and the coordinate data of a defect portion 3 as described above. Thus, in accordance with these data, the controller 230 is capable of accurately applying the repair material with respect to positions set around the defect portion 3.

FIG. 8 illustrates an application position set in the image around the defect portion.

The repair device 200 sets the center of the defect portion 3 as an application point P. Further, by applying the repair material with respect to the application point P by using the needle 213, the repair device 200 forms an uncured repair portion 5a at the center of the defect portion 3.

Figure 9B:
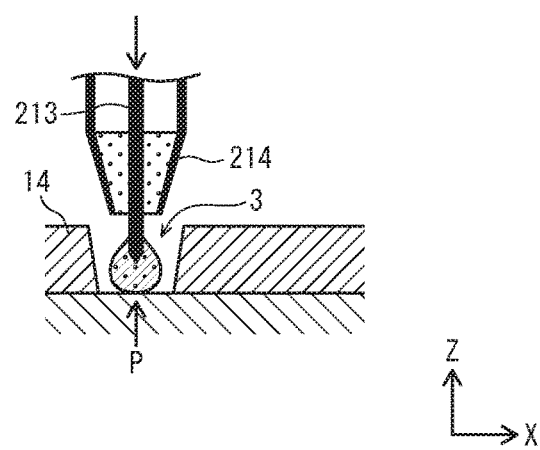
Figure 9C:
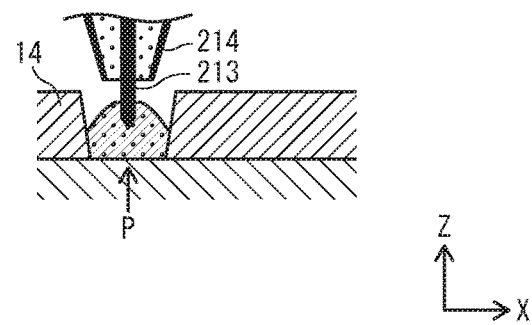
Figure 9D:
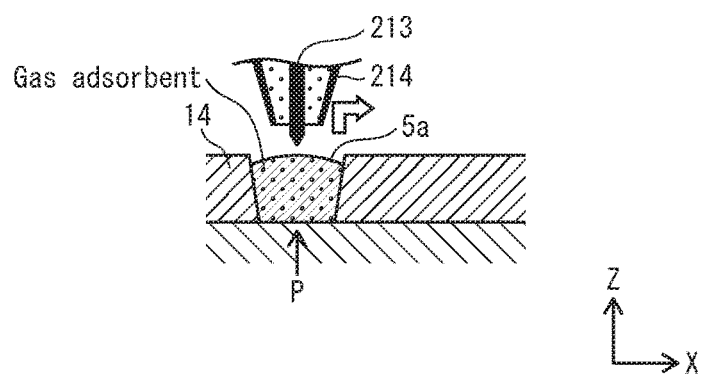

Here, first, the tank 214 is filled with the repair material as illustrated in FIG. 9A. Subsequently, as illustrated in FIG. 9B, with the needle 213 and the tank 214 positioned at application point P, the needle 213 is moved downward so that the repair material adheres to the needle 213, and then, the needle 213 is moved toward application point P to apply the repair material with respect to application point P. The repair material has fluidity until application. However, after application, the repair material maintains a mound shape. Thus, as illustrated in FIG. 9C, a mound of the repair material is formed at application point P. Then, the mound of the repair material so applied is dried, whereby an uncured repair portion 5a containing the gas adsorbent therein is formed as illustrated in FIG. 9D.

Further, by being cured through the subsequent ultraviolet light curing process, the uncured repair portion 5a becomes a repair portion 5 having higher physical stability. The irradiation with ultraviolet light is, for example, performed for 60 seconds to 180 seconds by using an ultraviolet ozone cleaner (e.g., the UV-1 UV-ozone cleaner manufactured by Samco Inc.).

[Baking of Repair Portion]

The baking process causes the repair portion 5 to release discharge gas. The baking is performed by irradiating the repair portion 5 with an infrared laser light.

Here, it is preferable that the repair portion 5 be baked at a temperature between 180° C. and 240° C. through irradiation with infrared laser light. Baking at a temperature lower than 180° C. results in insufficient discharge gas release. Meanwhile, baking at a temperature higher than 240° C. results in the repair portion 5 becoming too hot and receiving damage such as deformation and decrease in ink repellency.

The irradiation with infrared laser light may be performed under any set of conditions, provided that the conditions ensure sufficient discharge gas release. In any case, it is preferable that the irradiation be performed so that the entire repair portion 5 receives energy uniformly.

To provide an example of preferable conditions under which the irradiation with infrared laser light is performed in the present embodiment, the irradiation is performed with power density set to 0.6 W/mm$^2$ and wavelength set to 808 nm, for a period of 60 seconds.

[Effects of Bank Repair Method]

FIG. 10A is a plan view diagram illustrating a state where, in the panel pertaining to the present Embodiment, a repair portion 5 formed at a defect portion 3 of a bank 14 has been baked, and an ink layer 15a (R) has been formed in one of adjacent groove spaces 20 between which the bank 14 having the defect portion 3 is located through the application of red ink and an ink layer 15a (G) has been formed in the other one of the adjacent groove spaces 20 through the application of green ink.

Meanwhile, FIG. 10B is a plan view diagram illustrating a state where, in a comparative example in which a repair portion 5 is not formed, an ink layer 15a (R) and an ink layer 15a (G) have been formed in adjacent groove spaces 20 between which a bank 14 having a defect portion 3 is located.

Further, FIG. 10C is a plan view diagram illustrating a state where, in a comparative example in which a repair portion 5 is formed at a defect portion 3 of a bank 14 but is baking is not performed, an ink layer 15a (R) and an ink layer 15a (G) have been formed in adjacent groove spaces 20 between which a bank 14 having a defect portion 3 is located.

As illustrated in FIG. 10B, without the repair portion 5 formed at the defect portion 3, the red ink and the green ink mix via the defect portion 3 and produce color mixture regions that spread in the ink layers 15a. The color mixture regions may extend far along the Y direction, and the length thereof may extend to around 1 cm.

Once the manufacturing of the display panel 100 is completed, these color mixture regions emit light having a color different from the originally intended color. Specifically, as already described above, a color mixture region formed by mixing of red ink and green ink emits red light. Accordingly, when such a color mixture region is formed in a region intended to emit green light, the color mixture region emits red light, and causes light-emission color failure.

Further, when baking of the repair portion 5 is not performed as illustrated in FIG. 10C, the repair portion 5 gradually releases discharge gas. This discharge gas causes ink layers 15a (light-emitting layers 15) near the repair portion 5 to undergo degradation, and results in the forming of dark spots.

In contrast, a bank 14 having a defect portion 3 is repaired by forming a repair portion 5 containing a gas adsorbent at the defect portion 3 in the present embodiment. Thus, the present embodiment prevents the occurrence of color mixture regions and dark spots.

[Distance Between Defect Portion 3 and Repair Portion 5, and Height and Width of Repair Portion 5]

The following is a consideration regarding the height of repair portions 5 (i.e., the height of repair portions 5 from bottom surfaces of groove spaces 20).

Here, when the height of the repair portions 5 is overly low, the function of the repair portions 5 of partitioning ink layers 15a is impaired, and color mixture occurs. Meanwhile, if the repair portions 5 were to have overly high height, the risk would increase of tier cutting occurring in layers to be formed above the repair portions 5, e.g., the electron transport layer 16 and the common electrode 17. Based on this consideration, it is preferable to set the height of the repair portions 5 to be no less than 50% and no more than 200% of the height of the banks 14. It is particularly preferable to set the height of a lowest part of the repair portions 5 to be no lower than 80% of the height of the banks 14 and to set the height of a highest part of the repair portions 5 to be no higher than the height of the banks 14.

Embodiment 2

Embodiment 1 provides description of a case where a defect portion 3 is a missing portion of a bank. Meanwhile, embodiment 2 provides description of a case where a defect portion 3 is a portion of a bank where a foreign particle has adhered. The foreign particle is, for example, a piece of metal originating in manufacturing equipment, or dust/dirt originating in the atmosphere. The dust/dirt tends to be a piece of fabric.

FIG. 11A illustrates an example in which a foreign particle has adhered onto one bank 14 and has become a defect portion 3. Even when the defect portion 3 is portion to which a foreign particle has adhered, the foreign particle may mediate color mixture between ink layers 15a formed in adjacent groove spaces between which the portion is located.

Further, FIG. 11B illustrates an example where a foreign particle having entered the inside of one bank 14 and having penetrated through a wall surface of the bank 14 from one groove space to an adjacent groove space has become a defect portion 3. Further, FIG. 11C illustrates an example where a foreign particle having slipped beneath one bank 14 and having penetrated the bank 14 from one groove space to an adjacent groove space has become a defect portion 3. With a foreign particle inside or beneath a bank 14, a gap serving as an ink flow channel may be formed given poor adhesion between the foreign particle and the bank material. Particularly, when the foreign particle is a piece of fabric, the foreign particle itself unfortunately serves as an ink flow channel by adsorbing ink. As such, even when the defect portion 3 is a foreign particle inside or beneath a bank 14, the defect portion 3 may bring about color mixture between ink layers 15a formed in adjacent groove spaces between which the foreign particle is located.

Even when the defect portion 3 detected is a defect portion brought about by a foreign particle as described above, the bank 14 having the defect portion 3 is repaired through the forming of repair portions 5.

[Method for Repairing Bank having Defect Portion]

In embodiment 2, a bank 14 having a defect portion 3 is repaired by causing the dispenser 212 to apply the repair material over the ground substrate 11 mounted on the table 202 so as to surround the defect portion 3 and thereby forming repair portions 5.

Here, as illustrated in FIG. 12, repair portions 5 are formed in each of adjacent groove spaces 20 between which the bank 14 having the defect portion 3 is located. The repair portions 5 in each groove space 20 are such that one of the repair portions 5 extends between point $A_1$ of the bank 14 having the defect portion 3 and an adjacent bank 14, and the other of the repair portions 5 extends between point $A_2$ of the bank having the defect portion 3 and the adjacent bank 14. Points $A_1$ and $A_2$ are points of the bank 14 having the defect portion 3 between which the defect portion 3 is located in the Y direction. Accordingly, a total of four repair portions 5 are formed in the groove spaces 20 around the defect portion 3, and the repair portions 5 partition the groove spaces 20 in the X direction and form a lattice structure. Further, the repair portions 5 each have the shape of a dam.

A repair portion 5 in a groove space 20 is formed by using the dispenser 212 and applying the repair material with respect to a plurality of predetermined positions set along a line on which the repair portion 5 is to be formed.

The controller 230 of the repair device 200 stores image data of the banks 14 and the coordinate data of a defect portion 3 as described above. Thus, in accordance with these data, the controller 230 is capable of accurately applying the repair material with respect to positions set around the defect portion 3.

FIG. 13A illustrates application positions set in the image around the defect portion 3.

As illustrated in FIG. 13A, in each of the adjacent groove spaces between which a bank 14 having the defect portion 3 is located, application points $P_1$, $P_2$, $P_3$, $P_4$ are set along each of a dam forming line extending in the X direction through point $A_1$ and a dam forming line extending in the X direction through point $A_2$. Point $A_1$ is set at a distance $a_1$ in the Y direction from a reference point O, which corresponds to a center portion of the defect portion 3, and point $A_2$ is set at a distance $a_2$ in the direction opposite the Y direction from the reference point O.

Here the distance $a_1$ and the distance $a_2$ may be the same or may be different. In either case, the distance $a_1$ and the distance $a_2$ are to be set appropriately so that the entire defect portion 3 is between point $A_1$ and point $A_2$. However, setting overly great values to the distance $a_1$ and the distance $a_2$ is not preferable.

FIG. 13B is a schematic cross-sectional view illustrating a cross-section of the ground substrate 11 taken along the dam formation line passing through point $A_1$.

The repair device 200 forms a repair portion 5 by applying the repair material with respect to the application points $P_1$, $P_2$, $P_3$, $P_4$, which have been set as described above, one after another by using the needle 213.

FIGS. 14 through 14G are diagrams illustrating how a repair portion 5 is formed by applying the repair material, which contains the gas adsorbent mixed therein, with respect to the application points $P_1$, $P_2$, and so on one after another.

First, as illustrated in FIGS. 14 and 14B, with the needle 213 and the tank 214 positioned at application point $P_1$, the needle 213 is moved downward so that the repair material, which contains the gas adsorbent mixed therein, adheres to the needle 213. Then, the needle 213 is moved toward application point $P_1$ to apply the repair material with respect to application point $P_1$.

The repair material has fluidity until application. However, after application, the repair material maintains a mound shape. Thus, as illustrated in FIG. 14C, a mound of the repair material is formed at application point $P_1$.

Subsequently, as illustrated in FIG. 14D, the needle 213 is withdrawn upwards into the tank 241, and the needle 213 and the tank 214 are moved to application point $P_2$. Then, the needle 213 is moved downward so that the repair material adheres to the needle 213, and the needle 213 is moved toward application point $P_2$ to apply the repair material with respect to application point $P_2$.

Thus, the mound of the repair material that is formed at application point $P_2$ connects to the mound of the repair material having been formed at application point $P_1$, as illustrated in FIG. 14E.

Then, as illustrated in FIG. 14F, the needle 213 is withdrawn upwards and moved to application point $P_3$. Then, in a similar manner as described above, a mound of the repair material is formed at application point $P_3$, which connects to the mound of the repair material having been formed at application point $P_2$.

As such, mounds of the repair material are formed continuously on a line extending from point $A_1$ on the bank 14 having the defect portion 3 to an adjacent bank 14. Then, the mounds of the repair material so applied are dried and exposed to light as needed, thereby forming a repair portion 5.

Further, by being cured through the subsequent ultraviolet light curing process, the applied repair material becomes a repair portion 5 having higher physical stability.

In addition, baking of the repair portion 5, which is constituted of cured repair material, is performed by irradiating the repair portion 5 with infrared laser light, to cause the repair portion 5 to release discharge gas to the outside.

A pair of repair portions 5 is formed in each of groove spaces 20 between which a bank 14 having a defect portion 3 is located, as illustrated in FIG. 12. The repair portions 5 in each groove space 20 partition the groove space 20 into a first space SA in the vicinity of the defect portion 3, and two second spaces SB outside the vicinity of the defect portion 3. Further, the defect portion 3 is surrounded by two first spaces SA.

The light-emitting layer formation process of the subsequent step, which is for forming organic light-emitting layers 15 in the respective groove spaces 20, is performed with any bank 14 having a defect portion 3 having been repaired in such a manner. Due to this, the ink applied fills both the first space SA and the second spaces SB, whereby organic light-emitting layers 15 are formed in the first space SA and the second spaces SB. Accordingly, in the panel after the forming of light-emitting layers, repair portions 5 partition an organic light-emitting layer 15 in the first space SA from organic light-emitting layers 15 in the second spaces SB.

[Effects of Bank Repair Method]

FIG. 15A is a plan view diagram illustrating a state where, in the panel pertaining to the present Embodiment, repair portions 5 have been formed around a bank 14 having a defect portion 3, and an ink layer 15a (R) has been formed in one of adjacent groove spaces 20 between which the bank 14 having the defect portion 3 is located through the application of red ink and an ink layer 15a (G) has been formed in the other one of the adjacent groove spaces 20 through the application of green ink.

Meanwhile, FIG. 15B is a plan view diagram illustrating a state where, in a comparative example in which repair portions 5 are not formed, an ink layer 15a (R) and an ink layer 15a (G) have been formed in adjacent groove spaces 20 between which a bank 14 having a defect portion 3 is located.

Further, FIG. 15C is a plan view diagram illustrating a state where, in a comparative example in which repair portions 5 are formed with respect to a defect portion 3 of a bank 14 but baking is not performed, an ink layer 15a (R) and an ink layer 15a (G) have been formed in adjacent groove spaces 20 between which a bank 14 having a defect portion 3 is located.

As illustrated in FIG. 15B, without the repair portions 5 formed around the bank 14 having the defect portion 3, the red ink and the green ink mix via the defect portion 3 and produce color mixture regions that spread in the ink layers 15a. When such a color mixture region is formed in a region intended to emit green light, the color mixture region emits red light, and causes light-emission color failure.

Further, when baking of the repair portions 5 is not performed as illustrated in FIG. 15C, the repair portions 5 gradually release discharge gas. This discharge gas causes ink layers 15a (light-emitting layers 15) in color mixture regions to undergo degradation, and results in the forming of dark spots in the color mixture regions. This results in both of the two color mixture regions partitioned by the bank 14 having the defect portion 3 not emitting any light. Note that if the dark spots were not formed, one of the two color mixture regions whose originally intended light-emission color is green would emit red light, and the other one of the two color mixture regions whose originally intended light-emission color is red would emit red light even though color mixture has occurred.

In view of this, in the present embodiment, as described above, pairs of repair portions 5 are disposed around a bank 14 having a defect portion 3. Each pair of repair portions 5 partitions a groove space 20 into a first space SA that is the space between the two repair portions 5 and that is in the vicinity of the defect portion 3, and two second spaces SB that are located outside the two repair portions 5 and that are not in the vicinity of the defect portion 3. Due to this, the color mixture region is confined within a specific area, as described in the following. Further, due to being baked, the repair portions 5 do not release any discharge gas. As such, the occurrence of dark spots in color mixture regions is prevented. Further, almost the banks 14 receive almost no heat during the baking of the repair portions 5. Due to this, damage to the banks 14 that may otherwise occur, such as a decrease in ink repellency of surface portions of the banks 14, and deformation of banks 14 and a consequent change in taper angle of the banks 14, does not occur.

In addition, providing the repair portions 5 with the shapes of dams as described above enables performing the repair of defect portions 3 with ease. Specifically, the recent increase in pixel definition has resulted in a reduction in the widths of banks 14. Reduced bank width makes the accurate positioning of an application needle difficult. However, accurate positioning of application needle is unnecessary with repair portions having dam shapes or similar shapes. Due to this, repair can be performed with ease.

Also, when the defect portion 3 is a foreign particle, there are many cases where the defect portion 3 cannot be repaired properly due to the foreign particle repelling the repair material. However, with repair portions 5 having dam shapes, repair can be performed relatively easily even when the defect portion 3 is a foreign particle.

<Modifications>

The embodiments provide description of repair performed with respect to a defect portion in the line bank structure. However, the defect portion repair can be similarly applied to the pixel bank structure.

The embodiments are described while taking a top emission organic EL panel as an example. However, the embodiments are also applicable to a bottom emission organic EL panel.

INDUSTRIAL APPLICABILITY

The present invention is applicable to an organic EL display device used, for example, in various display devices, television devices, portable electronic device displays, and so one used in private homes, public facilities, and for commercial use. The present invention is also applicable to a manufacturing method of such an organic EL display device, and a bank repair method employed in the manufacturing method.

LIST OF REFERENCE SIGNS

1 Organic EL display device
3 Defect portion
5 Repair portion
11 Substrate
14 Bank
17 Common electrode

The invention claimed is:

1. A bank repair method for repairing a defect portion of a bank in a process of manufacturing an organic electroluminescence (EL) display device including a substrate, banks formed over the substrate, and light-emitting layers formed in concave spaces defined by the banks, the bank repair method comprising:
examining whether or not a bank having a defect portion is present; and
when the bank having the defect portion is present,
repairing the bank by applying a repair material containing a gas adsorbent to the defect portion and curing the repair material; and
after curing the repair material, baking the repair material by irradiating the repair material with infrared laser light,
wherein the gas adsorbent is zeolite.

2. The bank repair method of claim 1, wherein
the repair material is baked at a temperature between 180° C. and 240° C. through irradiation with the infrared laser light.

3. An organic electroluminescence (EL) display device comprising:
a substrate;
banks formed over the substrate; and
light-emitting layers disposed in concave spaces defined by the banks, wherein a defect portion is present in the banks, and the defect portion has been repaired by using a repair material containing a gas adsorbent, and the gas adsorbent is zeolite.

4. The organic EL display device of claim 3, wherein a height of a highest part of the repair portion is no higher than a height of the banks, and a height of a lowest part of the repair portion is no lower than 80% of the height of the banks.

5. A method for manufacturing an organic EL display device by forming banks over a substrate and forming light-emitting layers in concave spaces defined by the banks, the method comprising:

examining whether or not a bank having a defect portion is present;

when the bank having the defect portion is present,
repairing the bank by applying a repair material containing a gas adsorbent to the defect portion and curing the repair material; and after curing the repair material, baking the repair material by irradiating the repair material with infrared laser light; and forming the light-emitting layers after baking the repair material, wherein the pas adsorbent is zeolite.

* * * * *